United States Patent
Tsukamoto

(10) Patent No.: US 8,871,585 B2
(45) Date of Patent: Oct. 28, 2014

(54) MANUFACTURING METHOD OF SEMICONDUCTOR DEVICE AND SEMICONDUCTOR DEVICE

(75) Inventor: Masanori Tsukamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 359 days.

(21) Appl. No.: 13/116,727

(22) Filed: May 26, 2011

(65) Prior Publication Data

US 2011/0309451 A1   Dec. 22, 2011

(30) Foreign Application Priority Data

Jun. 18, 2010 (JP) ................. 2010-139847

(51) Int. Cl.
| H01L 31/072 | (2012.01) |
|---|---|
| H01L 21/8238 | (2006.01) |
| H01L 29/423 | (2006.01) |
| H01L 21/28 | (2006.01) |
| H01L 29/66 | (2006.01) |
| H01L 29/78 | (2006.01) |

(52) U.S. Cl.
CPC ..... *H01L 21/823807* (2013.01); *H01L 29/7833* (2013.01); *H01L 29/42376* (2013.01); *H01L 21/28114* (2013.01); *H01L 29/7843* (2013.01); *H01L 29/66545* (2013.01); *H01L 21/823842* (2013.01); *H01L 21/823871* (2013.01)
USPC ........... 438/199; 438/197; 438/201; 438/300; 438/301; 438/302; 438/303

(58) Field of Classification Search
USPC .......................... 438/300–303, 197, 199, 201
See application file for complete search history.

(56) References Cited

U.S. PATENT DOCUMENTS

2012/0064679 A1 *   3/2012   Yu et al. ................ 438/199

FOREIGN PATENT DOCUMENTS

| JP | 2000-040826 | 2/2000 |
|---|---|---|
| JP | 2002-198441 | 7/2002 |
| JP | 2008-263168 | 10/2008 |
| JP | 2009-198441 | 9/2009 |
| WO | 02/43151 | 5/2002 |

OTHER PUBLICATIONS

T. Hirano et al.; High Performance nMOSFET with HfSix/HfO2 Gate Stack by Low Temperature Process; Technical Digest IEDM, p. 911; 2005.
S. Yamaguchi et al.; High Performance Dual Metal Gate CMOS with High Mobility and Low Threshold Voltage Applicable to Bulk CMOS Technology; Symp. VLSI Tech, p. 208; 2006.

(Continued)

*Primary Examiner* — Samuel Gebremariam
(74) *Attorney, Agent, or Firm* — Sony Corporation

(57) ABSTRACT

A manufacturing method of a semiconductor device includes: forming a first gate insulating film on a semiconductor substrate in first and second regions in an active area; forming first gate electrodes on the first gate insulating film in the first and second regions; forming source/drain regions by introducing impurities at both sides of the first gate electrode in the first and second regions; performing heat treatment of activating the impurities; forming a stress liner film so as to cover the whole surface of first gate electrodes in the first and second regions; removing the stress liner film at an upper portion of the first gate electrode in the second region while allowing the stress liner film at least at a portion in the first region to remain to expose the upper portion of the first gate electrode in the second region; forming a groove by removing the first gate electrode in the second region; and forming a second gate electrode in the groove.

10 Claims, 10 Drawing Sheets

(56) References Cited

OTHER PUBLICATIONS

T. Hirano et al.; High Performance pMOSFET with ALD-TiN/HfO2 Gate Stack on (110) Substrate by Low Temperature Process; ESSDERC, p. 121; 2006.

T. Ando et al.; Sub-1nm EOT HfSix/HfO2 Gate Stack Using Novel Si Extrusion Process for High Performance Application; Symp. VLSI Tech, p. 192; 2006.

C. M. Lai et al.; A novel "Hybrid" High-k/Metal Gate Process for 28nm High Performance CMOSFETs; Tech. Dig. IEDM, p. 655; 2009.

* cited by examiner

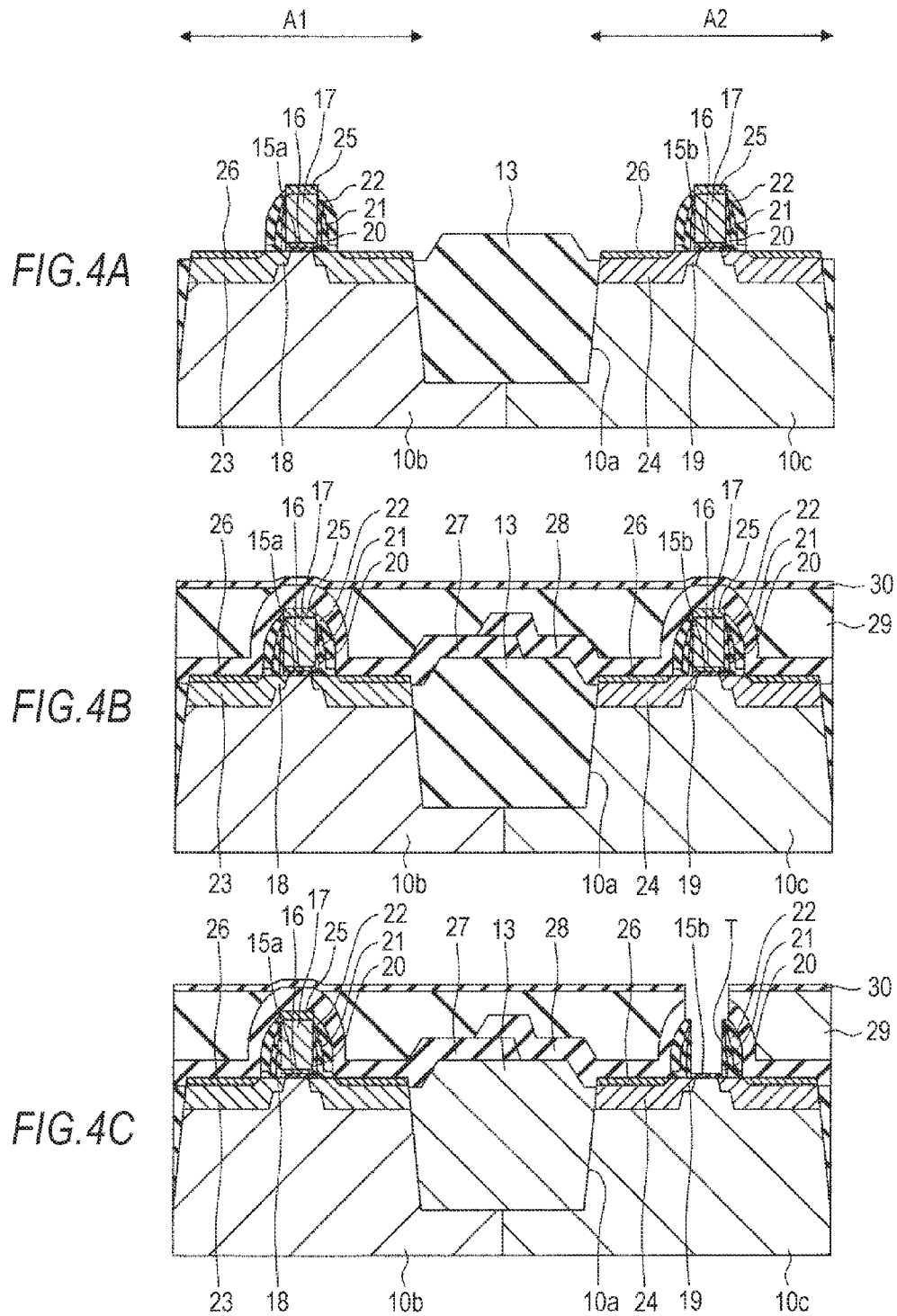

MANUFACTURING METHOD OF SEMICONDUCTOR DEVICE AND SEMICONDUCTOR DEVICE

FIELD

The present disclosure relates to a manufacturing method of a semiconductor device and the semiconductor device, and particularly relates to a manufacturing method of a semiconductor device and the semiconductor device having n-channel and p-channel field effect transistors.

BACKGROUND

A metal-insulator (oxide) semiconductor field effect transistor (MISFET or MOSFET) is a basic element of a semiconductor device. The MISFET is miniaturized more and more as miniaturization and high integration of the semiconductor device progress.

A structure in which an n-channel MISFET (hereinafter also referred to as NTr) and a p-channel MISFET (hereinafter also referred to as PTr) are included on the same substrate is generally called a CMOS circuit.

The CMOS circuit is widely used as a device included in many kinds of LSIs because power consumption is low as well as miniaturization and high integration are easy to realize high-speed operation in the device.

In related art, as a gate insulating film, a thermally-oxidized film of silicon (silicon oxide: $SiO_2$) or a film formed by nitriding the silicon oxide thermally or in plasma (silicon oxynitride: SiON) is widely used.

As a gate electrode, an n-type polysilicon layer to which phosphorus (P) or arsenic (As) is doped and a p-type polysilicon layer to which boron (B) is doped have been widely used to the NTr and the PTr.

However, when the gate insulating film is allowed to be thinner or a gate length is allowed to be reduced in accordance with a scaling law, increase of gate leak current and reduction of reliability occur by allowing the silicon oxide film and the silicon oxynitride film to be thinner.

Additionally, reduction of gate capacitance occurs due to a depletion layer formed in the gate electrode, therefore, a method of using an insulating material having a high-dielectric constant (a high-dielectric film) is used as the gate insulating film and a method of using a metal material as the gate electrode are proposed.

As materials for the high-dielectric film, for example, hafnium compounds and so on can be cited. Particularly, hafnium oxide ($HfO_2$) is a promising material in a point that reduction in electron/hole mobility can be suppressed while maintaining a high dielectric constant.

However, as disclosed in "High Performance nMOSFET with Hfsix/Hf02 Gate Stack by Low Temperature Process", T, Hirano et al., Tech. Dig. IEDM, p. 911 (2005) (Non-Patent Document 1), there is a problem that the reduction in characteristics such as reduction in carrier mobility occurs by performing high-temperature processing such as an activation annealing process of source/drain (S/D).

As metal materials for making a gate electrode, materials having a desired value in the work function (WF) can give good transistor characteristics.

In order to increase performance of an LSI, it is necessary that a short channel effect and so on are suppressed while achieving a lower threshold value as the MISFET, and metal materials of the gate electrode are desired to have the WF close to 4.1 eV in the NTr and 5.2 eV in the PTr.

Not so much metal material satisfying the above is known, and there is description of hafnium silicide (HfSix) in the NTr, ruthenium (Ru) and titanium nitride (TiN) in the PTr in "High Performance nMOSFET with HfSix/Hf02 Gate Stack by Low Temperature Process", K. Tai et al., ISTC, p 330 (2006); "High Performance Dual Metal Gate CMOS with High Mobility and Low Threshold Voltage Applicable to Bulk CMOS Technology", S. Yamaguchi et al., Symp. VLSI Tech., p. 192 (2006); "Sub-1 nm EOT HfSix/Hf02 Gate Stack Using Novel Si Extrusion Process for High Performance Application", T. Ando et al., Symp. VLSI Tech., p. 208 (2006); and "High Performance pMOSFET with ALD-TiN/Hf02 Gate Stack on (110) Substrate by Low Temperature Process", K. Tai et al., ESSDERC., p. 121 (2006) (Non-Patent Documents 2 to 5) and the like.

However, the WF value varies also in the above materials by performing a high-temperature processing step, which generates reduction of characteristics such as reduction in carrier mobility.

Accordingly, a manufacturing method in which a gate insulating film and a gate electrode are formed after performing the high-temperature processing step is disclosed in JP-A-2000-40826 (Patent Document 1) with respect to a related art manufacturing method in which the high-temperature processing step is performed after forming the gate insulating film and the gate electrode.

Hereinafter, a transistor structure formed by the manufacturing method in which the gate insulating film and the gate electrode are formed after performing high-temperature processing step will be referred to as a "gate-last structure".

On the other hand, a transistor structure formed by performing the high-temperature processing step after forming the gate insulating film and the gate electrode as in the related art will be referred to as a "gate-first structure".

In JP-A-2002-198441 (Patent Document 2), a method of forming the gate electrode by using metals having suitable WF on the NTr and the PTr respectively in the gate-last structure is disclosed.

In this case, a dummy gate is removed in a first region, a first gate insulating film is formed, a first gate electrode is formed by using a metal and the metal other than the portion to be the first gate electrode is removed by etching.

Next, a dummy gate is removed in a second region, a second gate insulating film is formed, a second gate electrode is formed and metal other than the portion of the second gate electrode is removed by etching.

According to the above processes, the gate electrodes having suitable WF can be formed on the NTr and the PTr respectively.

As the example applying the gate-last structure, a Full Silicidation (FUSI) technique using a compound of a polysilicon layer and a transition metal applying the metal as the gate electrode as described above.

It is difficult to form the NTr and the PTr by optimizing silicidation respectively, however, a method of fully siliciding only the gate electrode of the PTr by making an opening only in a PTr region as in JP-A-2009-117621 (Patent Document 3) is known.

In recent years, a technique (hereinafter, referred to as e-SiGe structure) of forming silicon germanium (SiGe) having a different lattice constant from silicon on a source/drain of transistors is known.

Moreover, a technique of modulating stress in a channel region of the transistor by forming a silicon nitride film (hereinafter, referred to as a stress liner film SL) of tensile stress or compression stress on the source/drain to thereby improve carrier mobility is applied as in International Publication WO2002/043151 pamphlet (Patent Document 4).

In the case where the stress liner film is formed on the source/drain in the transistor having the gate-last structure, a structure and a forming method in which an upper portion of the stress liner film is polished by a chemical mechanical polishing process and removed are applied such as in JP-A-2008-263168 (Patent Document 5).

Accordingly, the stress in the channel direction is reinforced to thereby realize a high-performance transistor having high carrier mobility.

In the above structure in which the upper portion of the stress liner film of the gate-last structure is polished by the CMP process and removed, the action of the stress due to the stress liner film is changed when removing the polysilicon layer which is a dummy gate. A difference occurs in effects with respect to carrier mobility between the NTr and the PTr due to the above change as shown in the following expressions (1), (2).

$$\frac{\mu_{xx}}{\mu_0} = 1 + 0.316 S_{xx} - 0.534 S_{yy} + 0.176 S_{zz} \quad (1)$$

$$\frac{\mu_{xx}}{\mu_0} = 1 - 0.718 S_{xx} + 0.011 S_{yy} + 0.663 S_{zz} \quad (2)$$

The expression (1) indicates an effect of a stress ($S_{xx}$, $S_{yy}$, $S_{zz}$) with respect to a ratio of mobility of electrons ($\mu_{xx}/\mu_0$). The expression (2) indicates an effect of the stress ($S_{xx}$, $S_{yy}$, $S_{zz}$) with respect to the ratio of mobility of holes ($\mu_{xx}/\mu_0$). Here, "xx" denotes a channel-length direction, "yy" denotes a vertical direction with respect to the channel and "zz" denotes a channel-width direction.

In Patent Document 5, the stress liner film of tensile stress is provided in the NTr and the stress liner film of compression stress is applied to the PTr.

In the case of the NTr in which electrons are carriers, the tensile stress in the "xx" direction ($+S_{xx}$) is increased and the compression stress in the "yy" direction ($-S_{yy}$) is reduced, thereby cancelling effects to the mobility as a coefficient of $S_{xx}$ is approximately the same as a coefficient of $S_{yy}$.

On the other hand, in the case of the PTr in which holes are carriers, the compression stress in the "xx" direction ($+S_{xx}$) is increased and the tensile stress in the "yy" direction ($-S_{yy}$) is reduced, however, the coefficient of $S_{xx}$ is larger than the coefficient of $S_{yy}$ by approximately 70 times, thereby obtaining effects of the increase of mobility due to action in the "xx" direction.

FIG. 10 shows results obtained by plotting relative variations of mobility in respective processes with respect to the gate pitch in the NTr having the gate-last structure. In the drawing, (a) indicates mobility after forming the stress liner, (b) indicates mobility after removing the stress liner on the gate electrode, (c) indicates mobility after removing the polysilicon and (d) indicates mobility after forming the metal gate electrode. The relative mobility when there is no stress liner film is set to 1.0.

When the gate pitch is long (0.83 μl, 0.5 μm), the mobility is relatively increased after removing the polysilicon layer as shown in (c), whereas when the gate pitch is short (0.19 μm), the mobility is relatively reduced after removing the polysilicon layer.

This is because the effects to the mobility are cancelled as the coefficient of $S_{xx}$ is the approximately same as the coefficient of $S_{yy}$, as described above and that $S_{xx}$ is relatively reduced when the gate pitch is short, as a result, the mobility is reduced.

Accordingly, it is found that, as the distance between gates is reduced due to miniaturization of the semiconductor device, characteristics of the NTr is reduced in the gate-last structure is reduced as compared with the gate-first structure.

In the structure of Patent Document 3, a technique for applying the gate-first structure only to the NTr is disclosed.

However, as the process of removing the polysilicon layer in the PTr in the structure of Patent Document 3, the mobility of the PTr is not increased though reduction of mobility of the NTr is suppressed, therefore, it is difficult to obtain the high-performance CMOS circuit.

Additionally, there is a description concerning a method of using a high-dielectric constant film as the gate insulating film and using a metal material as the gate electrode in, for example, "A Novel "Hybrid" High-k/Metal Gate Process for 28 nm High Performance CMOSFETs", C. M. Lai et al., Tech. Dig. IEDM, p. 655 (2009) (Non-Patent Document 6).

The CMOS structure disclosed in Non-Patent Document 6 applies the gate-first structure for the NTr and applies the gate-last structure for the PTr, however, the CMOS structure has a process of removing the upper portion of the stress liner film by the chemical mechanical polishing process and removing the polysilicon layer in the NTr. Accordingly, the reduction of mobility in the NTr occurs. As a result, it is difficult to obtain the high-performance CMOS circuit particularly in a micro area in which the distance between gates is short.

SUMMARY

It is desirable to increase carrier mobility and realize high performance particularly in a micro area in which the distance between electrodes is short both in an n-channel MISFET (NTr) and a p-channel MISFET (PTr) included in a CMOS circuit.

An embodiment of the present disclosure is directed to a manufacturing method of a semiconductor device including forming a first gate insulating film on a semiconductor substrate in a first region as a forming region of an n-channel field effect transistor and in a second region as a forming region of a p-channel field effect transistor on the semiconductor substrate in an active area, forming first gate electrodes on the first gate insulating film in the first region and the second region, forming source/drain regions by introducing impurities in the semiconductor substrate at both sides of the first gate electrode in the first region and the second region, performing heat treatment of activating the impurities in the source/drain regions, forming a stress liner film applying stress on the semiconductor substrate so as to cover the whole surface of the first gate electrodes in the first region and the second region, removing the stress liner film at an upper portion of the first gate electrode in the second region while allowing the stress liner film at least at a portion formed in the first region to remain to expose the upper portion of the first gate electrode in the second region, forming a groove for forming a second gate electrode by removing the first gate electrode in the second region completely, and forming a second gate electrode in the groove for forming the second gate electrode.

In the manufacturing method of the semiconductor device according to the embodiment of the disclosure, the first gate insulating film is formed on the semiconductor substrate in the first region as the forming region of the n-channel field effect transistor and in the second region as the forming region of the p-channel field effect transistor on the semiconductor in the active area.

Next, the first gate electrodes are formed on the first gate insulating film in the first region and the second region.

Next, the source/drain regions are formed by introducing the impurities in the semiconductor substrate at both sides of the first gate electrode in the first region and the second region.

Next, the heat treatment of activating the impurities in the source/drain region is performed.

Next, the stress liner film applying stress on the semiconductor substrate so as to cover the whole surface of the first gate electrode in the first region and the second region.

Next, the stress liner film at the upper portion of the first gate electrode in the second region is removed while allowing the stress liner film at least at the portion formed in the first region to remain to expose the upper portion of the first gate electrode in the second region.

Next, the first gate electrode in the second region is completely removed to form the groove for forming the second gate electrode.

Next, the second gate electrode is formed in the groove for forming the second gate electrode.

Another embodiment of the disclosure is directed to a semiconductor device including a first gate insulating film formed on a semiconductor substrate in a first region as a forming region of an n-channel field effect transistor of the semiconductor substrate in an active area, a second gate insulating film formed on the semiconductor substrate in a second region as a forming region of a p-channel field effect transistor of the semiconductor substrate, a first gate electrode formed on the first gate insulating film in the first region, a second gate electrode formed on the second gate insulating film in the second region, in which a portion touching the second gate insulating film is made of a metal or a metal compound, source/drain regions formed by introducing impurities in the semiconductor substrate at both sides of the first gate electrode and the second gate electrode in the first region and the second region, and a stress liner film applying stress on the semiconductor substrate formed so as to cover the whole surface of the first gate electrode in the first region and cover regions other than an upper portion of the second gate electrode in the second region.

In the semiconductor device according to the embodiment of the disclosure, the first gate insulating film is formed on the semiconductor substrate in the first region as the forming region of the n-channel field effect transistor of the semiconductor substrate in the active region. The second gate insulating film is formed on the semiconductor substrate in the second region as the forming region of the p-channel field effect transistor.

The first gate electrode is formed on the first gate insulating film in the first region and the second gate electrode is formed on the second gate insulating film in the second region, in which the portion touching the second gate insulating film is made of the metal or the metal compound.

The source/drain regions are formed by introducing the impurities in the semiconductor substrate at both sides of the first gate electrode and the second gate electrode in the first region and the second region.

The stress liner film applying stress on the semiconductor substrate formed so as to cover the whole surface of the first gate electrode in the first region and cover regions other than an upper portion of the second gate electrode in the second region.

In the manufacturing method of the semiconductor device according to the embodiment of the disclosure, the carrier mobility can be increased and the high performance can be realized particularly in the micro area in which the distance between electrodes is short both in the n-channel MISFET (NTr) and the p-channel MISFET (PTr) included in the CMOS circuit.

In the semiconductor device according to the embodiment of the disclosure, the carrier mobility can be increased and the high performance can be realized particularly in the micro area in which the distance between electrodes is short both in the n-channel MISFET (NTr) and the p-channel MISFET (PTr) included in the CMOS circuit.

BRIEF DESCRIPTION OF THE DRAWINGS

FIGS. 4A to 4C are schematic cross-sectional views showing manufacturing processes in the manufacturing method of the semiconductor device according to the first embodiment of the disclosure;

DETAILED DESCRIPTION

Hereinafter, embodiments of a semiconductor device and a manufacturing method thereof in the present disclosure will be explained with reference to the drawings.

The explanation will be made in the following order.
1. First Embodiment (Basic structure)
2. Modification Example of First Embodiment
3. Second Embodiment (Method of forming a gate electrode of PTr to be higher than a gate electrode of NTr)

<First Embodiment>
[Structure of a Semiconductor Device]

Figure 1:
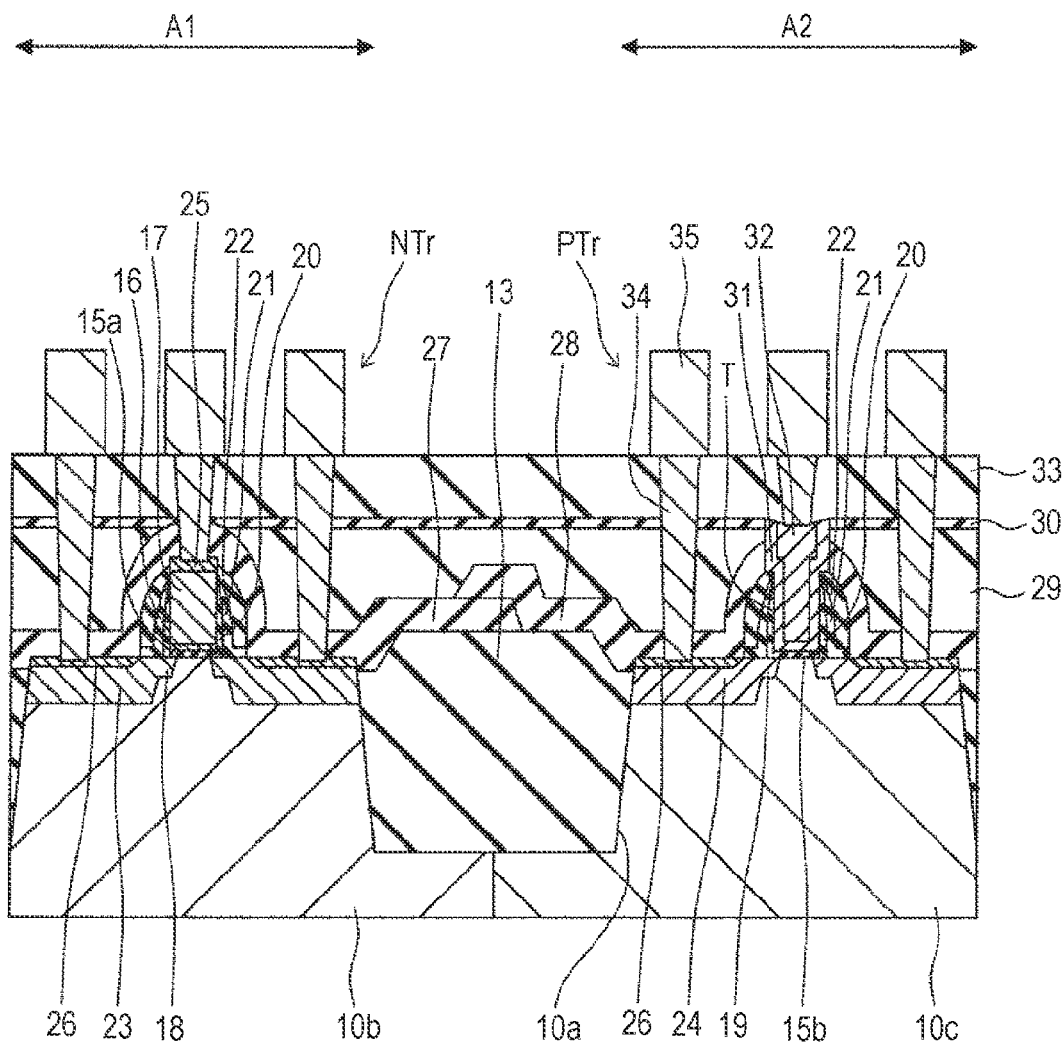
FIG. 1 is a schematic cross-sectional view of a semiconductor device according to a first embodiment of the disclosure.

FIG. 1 is a schematic cross-sectional view of a semiconductor device according to the embodiment.

For example, an element isolation trench 10a is formed and a STI (shallow trench isolation) element isolation insulating film 13 is formed so as to divide a semiconductor substrate made of a silicon substrate and so on into a first region A1 and a second region A2.

The first region A1 is a forming region of an n-channel field effect transistor (NTr) and the second region A2 is a forming region of a p-channel field effect transistor (PTr).

A p-type well 10b is formed in the first region A1 of the semiconductor substrate and an n-type well 10c is formed in the second region A2.

For example, a first gate insulating film 15a made of hafnium oxide ($HfO_2$) and the like is formed on the semiconductor substrate in the p-type well 10b region of the first region A1.

A first gate electrode made of a layered body and the like which includes a titanium nitride (TiN) film 16 and a polysilicon layer 17 is formed over the first gate insulating film 15a.

As the first gate insulating film 15a, so-called High-k (high-dielectric constant) materials having higher dielectric constant than silicon oxide such as hafnium oxide silicon (HfSiO), hafnium oxide silicon nitride (HfSiON), zirconium oxide (ZrOx) can be also used.

In a portion touching the first gate insulating film 15a of the first gate electrode, a film made of a metal or a metal compound having a work function suitable for the NTr is used, and the TiN film 16 is used in the embodiment.

A sidewall insulating film made of a layered body including a silicon nitride film 20, a silicon oxide film 21 and a silicon nitride film 22 is formed at both sides of the first electrode.

For example, in a surface layer portion of the P-type well 10b of the semiconductor substrate at both sides of the first gate electrode, an n-type extension region 18 and an n-type source/drain region 23 extending to a lower portion of the first gate electrode are formed.

For example, high-melting point metal silicide layers (25, 26) such as NiSi are formed on surface layer portions of the polysilicon layer 17 of the first gate electrode and the source/drain region 23 respectively.

According to the above, an n-channel field effect transistor (NTr) is formed.

For example, a second gate insulating film 15b made of hafnium oxide and so on is formed on the semiconductor substrate in the n-type well 10c region in the second region A2.

A second gate electrode made of a layered body and the like which includes a titanium nitride (TiN) 31, a conductive layer 32 made of aluminum and the like is formed over the second gate insulating film 15b.

As the second gate insulating film 15b, so-called High-k (high-dielectric constant) materials having higher dielectric constant than silicon oxide such as hafnium oxide silicon (HfSiO), hafnium oxide silicon nitride (HfSiON), zirconium oxide (ZrOx) can be also used.

The first gate insulating film 15a and the second gate insulating film 15b can be made of the same insulating material as long as necessary dielectric constant characteristics and so on correspond to each other, and a case where the same insulating material is used is shown in the embodiment.

At the same time, the first gate insulating film 15a and the second gate insulating film 15b can be made of different materials according to necessary dielectric constant characteristics and so on, which will be explained in a later-described modification example.

In a portion touching the second gate insulating film 15b of the second gate electrode, a film made of a metal or a metal compound having a work function suitable for the PTr is used. For example, ruthenium (Ru), tantalum carbide (TaC) and the like can be suitably used in addition to the above titanium nitride.

Additionally, it is preferable to use metals with low resistance as the conductive layer 32 such as copper (Cu) and tungsten (W), in addition to the above aluminum.

The sidewall insulating film made of the layered body including the silicon nitride film 20, the silicon oxide film 21 and the silicon nitride film 22 is formed at both sides of the second gate electrode.

The first gate insulating film and the second gate insulating film are formed by using the high-dielectric constant film, and the metal or the metal compound is used for portions touching the gate insulating films of the first gate electrode and the second gate electrode, thereby allowing effective gate oxide thickness (EOT) to be thinner.

For example, in the surface layer portion of the n-type well 10c of the semiconductor substrate at both sides of the second gate electrode, a p-type extension region 19 and a p-type source/drain region 24 extending to a lower portion of the second gate electrode are formed.

For example, the high-melting point metal silicide layer 26 such as NiSi is formed on a surface layer portion of the source/drain region 24.

As described above, a p-channel field effect transistor (PTr) is formed.

In the first region A1, a first stress liner film 27 made of silicon nitride and the like is formed on the whole surface of the region so as to cover the NTr.

On the other hand, in the second region A2, a second stress liner film 28 made of silicon nitride is formed on the whole surface of the region so as to cover the PTr. Here, the second stress liner film 28 is formed on the whole surface of the region so as to cover regions other than the upper portion of the second gate electrode.

The first stress liner film 27 and the second stress liner film 28 are respectively films for applying stress on the semiconductor substrate.

The first stress liner film 27 preferably has characteristics in which stress is applied to the semiconductor substrate so as to improve characteristics of the NTr, which is, for example, the film for applying tensile stress on the semiconductor substrate with respect to a gate length direction of the first gate electrode.

The second stress liner film 28 preferably has characteristics in which stress is applied to the semiconductor substrate so as to improve characteristics of the PTr, which is, for example, the film for applying compression stress on the semiconductor substrate with respect to a gate length direction of the second gate electrode.

When stress characteristics different from each other are given to the NTr and the PTr respectively, the structure in which the stress liner films having different stress characteristics are formed in the first region A1 and the second region A2 is applied.

When the same stress characteristics are allowed, the common stress liner film can be formed.

In the first region A1 and the second regio A2, a first insulating film 29 made of silicon oxide and so on is formed on surfaces of the first stress liner film 27 and the second stress liner film 28.

On the surface of the first insulating film 29, a polish stopper film 30 made of silicon nitride and so on is formed.

A second insulating film 33 made of silicon oxide and so on is formed on the surface of the polish stopper film 30.

Openings reaching the gate electrodes and the source/drain regions of the NTr and the PTr are formed so as to pierce through the second insulating film 33, the polish stopper film 30 and the first insulating film 29, in which contact plugs 34 are buried. Moreover, an upper wiring 35 is formed on the surface of the second insulating film 33 so as to connect to the contact plugs 34.

The NTr is a transistor having the gate-first structure in which the stress liner film for giving tensile stress with respect to the gate length direction is formed on the whole surface, which can improve mobility of carriers (electrons) the NTr by applying the tensile stress on the semiconductor substrate.

The PTr is a transistor having the gate-last structure in which the stress liner film for giving compression stress with respect to the gate length direction is formed at regions other than the upper portion of the gate, which can improve mobility of carriers (holes) the PTr by applying the compression stress on the semiconductor substrate.

According to the above, the semiconductor device of the embodiment can increase the carrier mobility both in the n-channel MISFET (NTr) and the p-channel MISFET (PTr) included in the CMOS circuit. Therefore, high performance can be realized particularly in the micro area in which the distance between gate electrodes is short.

[Manufacturing Method of the Semiconductor Device]

A manufacturing method of the semiconductor device according to the embodiment will be explained with reference to FIGS. 2A to 2C to FIGS. 5A, 5B.

Figure 2A:
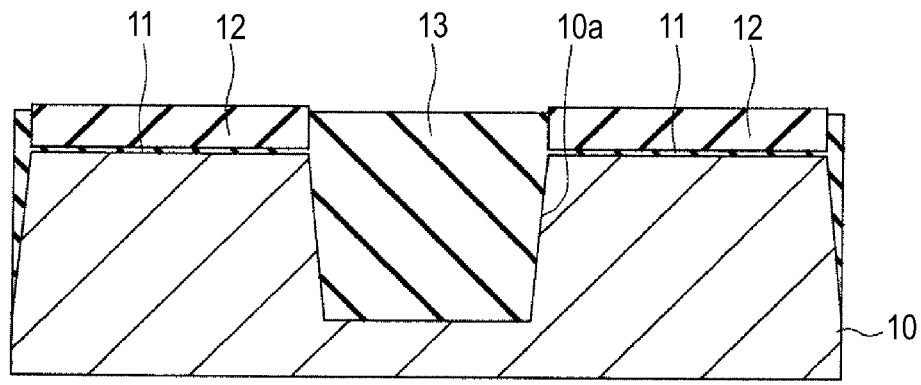
FIGS. 2A to 2C are schematic cross-sectional views showing manufacturing processes in a manufacturing method of the semiconductor device according to the first embodiment of the disclosure.

First, as shown in FIG. 2A, a silicon oxide film 11 is formed over a semiconductor substrate 10 by, for example, a dry oxidation process and a silicon nitride film 12 is deposited by a reduced-pressure CVD method and so on in the first region A1 and the second region A2.

A resist film having a pattern protecting the first region A1 and the second region A2 is patterned by using a photolithography process.

Next, etching processing such as RIE (reactive ion etching) is performed by using the resist film as a mask to remove the silicon oxide film 11 and the silicon nitride film 12 at portions other than the first region A1 and the second region A2.

Furthermore, the semiconductor substrate 10 is etched to the depth of, for example, 350 to 400 nm to form the element isolation trench 10a for the STI.

Next, a silicon oxide film is deposited to have a thickness of 650 nm to 700 nm so as to fill the element isolation trench 10a by, for example, a high-density plasma CVD method and the like. The dense film with good step coverage can be formed by the high-density plasma CVD method.

Subsequently, the silicon oxide at the outside of the trench for STI is removed to form the STI element isolation insulating film 13. The silicon oxide film is polished from the upper surface until the upper surface of the silicon nitride film 12 is exposed by, for example, a CMP (chemical mechanical polishing) process to planarize the film. The forming region of the silicon nitride film 12 is polished to a degree that the silicon oxide film on the silicon nitride film is removed.

It is also possible to remove the silicon oxide film in the wide active region by lithography patterning and etching processing in advance for reducing the global step by CMP.

The forming region of the STI element isolation insulating film 13 is a field oxide film region, the region where the silicon nitride film 12 is formed is the active region (the first region A1 and the second region A2).

Figure 2B:
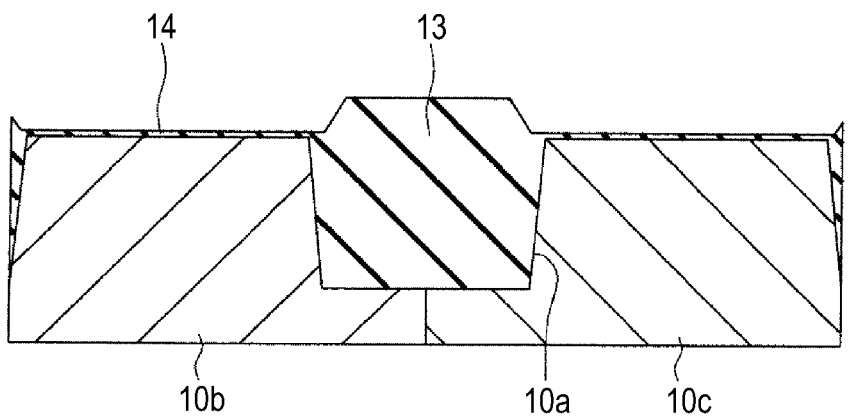

Next, as shown in FIG. 2B, the silicon nitride film 12 is removed by hot phosphoric acid in the first region A1 and the second region A2. It is also preferable to perform annealing in nitrogen, oxygen, hydrogen/oxygen before removing the silicon nitride film 12 to allow the STI element isolation insulating film 13 to be dense as well as for rounding corner portions of the active region.

In the above state, the silicon oxide film 11 is substantially removed. Here, the surface of the active region is oxidized to have a film thickness of 10 nm in the first region A1 and the second region A2 to form a sacrificial oxide film 14.

Next, the p-type well 10b is formed by ion implantation in the first region A1. Further, ion implantation for forming an embedded layer for preventing punch-through and ion implantation for adjusting a threshold Vth of the NTr are performed.

Additionally, the n-type well 10c is formed in the second region A2 by ion implantation. Further, ion implantation for forming an embedded layer for preventing punch-through and ion implantation for adjusting a threshold Vth of the PTr are performed.

Figure 2C:
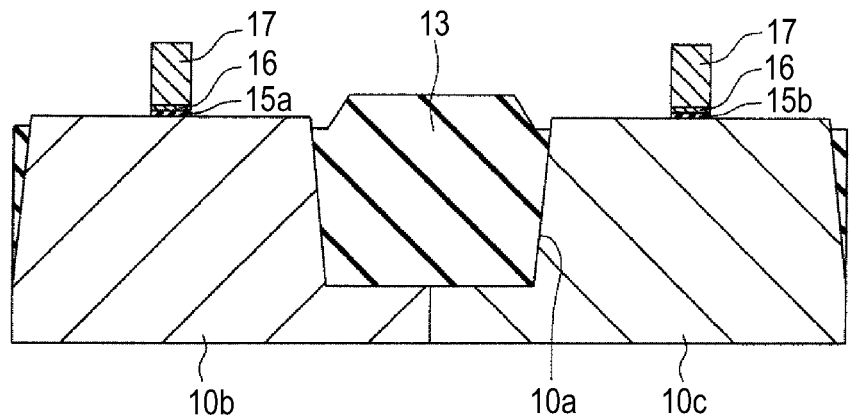

Next, as shown in FIG. 2C, the sacrificial oxide film 14 is peeled off in the first region A1 and the second region A2 by, for example, an HF solution to form an interfacial oxide silicon film (not shown) to have a film thickness of 0.5 to 1.5 nm.

As methods for forming the interfacial oxide silicon film, an RTO (Rapid Thermal Oxidization) process, an oxygen plasma process and a chemical oxidization process by, for example, processing of hydrogen peroxide chemicals can be cited.

Next, the first gate insulating film 15a and the second gate insulating film 15b are formed by, for example, a CVD (Chemical Vapor Deposition) method or an ALD (Atomic Layer Deposition) method to have a film thickness of approximately 2 to 3 nm in the first region A1 and the second region A2.

As the first gate insulating film 15a and the second gate insulating film 15b, so-called High-k (high-dielectric constant) materials having higher dielectric constant than silicon oxide such as hafnium oxide ($HfO_2$), hafnium oxide silicon (HfSiO), hafnium oxide silicon nitride (HfSiON), zirconium oxide (ZrOx) can be also used.

In the present embodiment, the case where the first gate insulating film 15a and the second gate insulating film 15b use the same insulating material is shown.

Next, the TiN film 16 is formed to have a film thickness of 5 to 20 nm by, for example, a sputtering method, the CVD method, the ALD method and so on in the first region A1 and the second region A2. It is also possible that a thin film made of La, LaOx, AlOx and so on can be inserted with a thickness of approximately 0.1 to 1.0 nm under the TiN film 16 for controlling the threshold Vth of the transistor.

Next, the polysilicon layer 17 is deposited to have a film thickness of 50 to 150 nm by the reduced-pressure CVD method with a deposition temperature of 580 to 620° C. by using, for example, $SiH_4$ as a source gas in the first region A1 and the second region A2.

Subsequently, a resist film having a pattern of the first gate electrode and the second gate electrode is pattern-formed by the photolithography process to be processed to be a pattern of the gate electrodes by anisotropic etching using an etching gas of HBr or Cl.

According to the above, the first gate electrode and the second gate electrode made of the layered body and the like including the titanium nitride (TiN) film 16 and the polysilicon layer 17 are formed respectively in the first region A1 and the second region A2.

It is also possible to form the gate electrode pattern finely by trimming processing using oxygen plasma after the resist patterning, and the gate length can be formed to be approximately 20 to 30 nm in, for example, a 32 nm node technique (hp45).

Figure 3A:
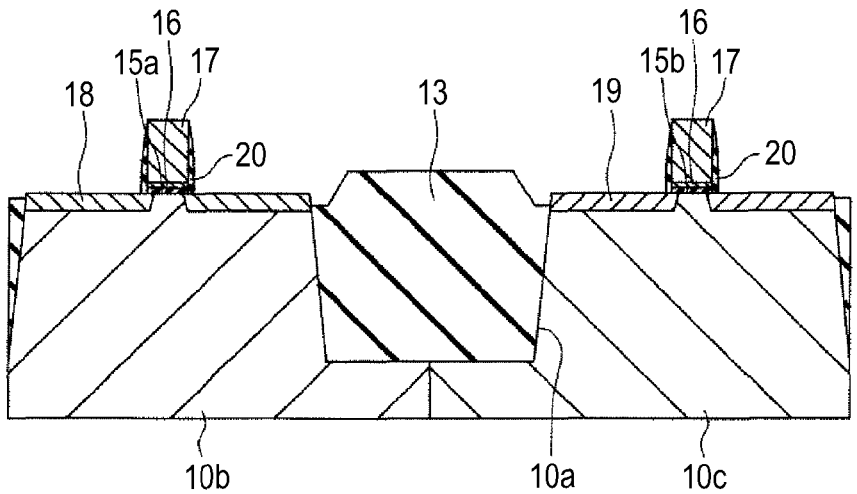
FIGS. 3A to 3C are schematic cross-sectional views showing manufacturing processes in the manufacturing method of the semiconductor device according to the first embodiment of the disclosure.

Next, the silicon nitride film is deposited to be approximately 5 to 15 nm by, for example, the reduced-pressure CVD method in the first region A1 and the second region A2 as shown in FIG. 3A and etched back by the anisotropic etching to form the silicon nitride film 20 forming the sidewall insulating film.

Next, in the first region A1, As+ is ion-implanted with 5 to 10 keV, 5 to $20 \times 10^{14}/cm^2$ by using the first gate electrode and the silicon nitride film 20 as a mask to form the n-type extension region 18.

Also in the first region A1, $BF_2+$ is ion-implanted with 3 to 5 keV, 5 to $20 \times 10^{14}/cm^2$ by using the first gate electrode and the silicon nitride film 20 as a mask to form the p-type extension region 19.

The above ion implantation is performed after forming the silicon nitride film 20 which is an offset spacer to thereby suppress the short channel effect and suppressing variations in transistor characteristics.

Figure 3B:
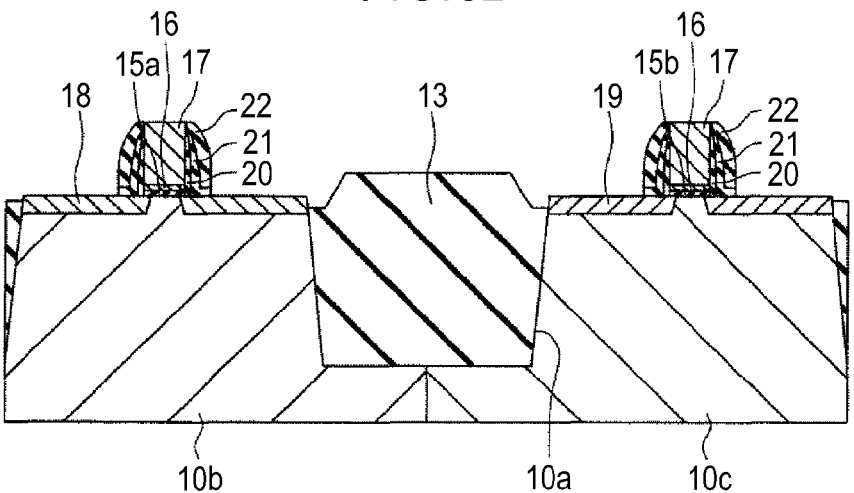

Next, as shown in FIG. 3B, the silicon oxide is deposited to have a film thickness of 10 to 30 nm by, for example, the plasma CVD method in the first region A1 and the second region A2 to thereby form the silicon oxide film 21.

Next, the silicon nitride is deposited to have a film thickness of 30 to 50 nm by, for example, the plasma CVD method to form the silicon nitride film 22.

Next, the silicon oxide film 21 and the silicon nitride film 22 are etched back by the anisotropic etching to form the sidewall insulating film including the silicon nitride film 20, the silicon oxide film 21 and the silicon nitride film 22.

Figure 3C:
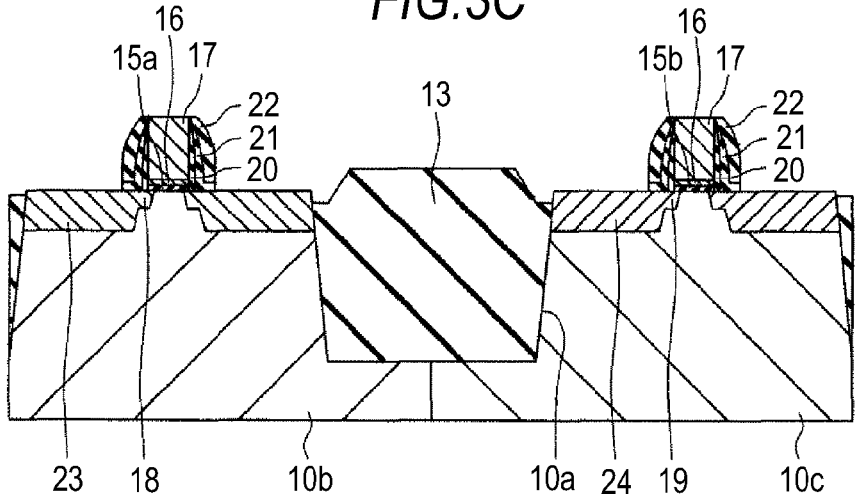

Next, as shown in FIG. 3C, As+ is ion-implanted with 40 to 50 keV, 1 to $2 \times 10^{15}/cm^2$ in the first region A1 by using the first gate electrode and the sidewall insulating film as a mask to form the n-type source/drain region 23.

In the second region A2, $BF_2+$ is ion-implanted with 5 to 10 keV, 1 to $2 \times 10^{15}/cm^2$ by using the second gate electrode and the sidewall insulating film as a mask to form the p-type source/drain region 24.

Next, an impurity is activated by an RTA process, for example, at 1000° C. for 5 seconds.

It is also possible to perform thermal processing by a spike RTA process for promoting dopant activation and suppressing diffusion.

Next, as shown in FIG. 4A, a high-melting point metal such as Ni is deposited to have a film thickness of 6 to 8 nm by the sputtering method and performs the RTA process at 300 to 450° C. for 10 to 60 seconds. According to the processing, only a portion touching silicon of the semiconductor substrate and the polysilicon layer forming the gate electrodes are solicited in a self-aligned manner.

Accordingly, the high-melting point metal silicide layers (25, 26) such as NiSi are respectively formed at the surface portions of the polysilicon layer 17 of the first gate electrode and the second gate electrode and the source/drain regions (23, 24) 22.

Next, unreacted Ni is removed by $H_2SO_4/H_2O_2$.

It is also possible to form $CoSi_2$ or NiSi by depositing Co or NiPt instead of Ni. In both cases, temperature of the RTA process can be suitably set.

Next, as shown in FIG. 4B, the first stress liner film 27 having tensile stress is formed on the whole surface of the first region A1. The first stress liner film 27 is formed by using the silicon nitride film having a film thickness of 30 to 50 nm and tensile stress of approximately 1.2 GPa by, for example, the plasma CVD method.

The first stress liner film 27 can be deposited by chemical reaction in the following conditions.

Nitrogen ($N_2$) gas: 500 to 2000 $cm^3$/minute
Ammonia ($NH_3$) gas: 500 to 1500 $cm^3$/minute
Monosilane ($SiH_4$) gas: 50 to 300 $cm^3$/minute
Substrate temperature: 200 to 400° C.
Pressure: 0.67 to 2.0 kPa
RF power: 50 to 500 W Furthermore, ultraviolet rays (UV) irradiation processing is performed in the following conditions after deposition.

Helium (He) gas: 10 to 20 liters/minute
Processing temperature: 400 to 600° C.
Pressure: 0.67 to 2.0 kPa
Ultraviolet rays (UV) ramp power: 1 to 10 kW After that, processing is performed so that the first stress liner film 27 remains only in the first region A1 by using the photolithography technique and a dry etching technique.

Next, the second stress liner film 28 having compression stress is formed on the whole surface of the second region A2. The second stress liner film 28 is formed by using the silicon nitride film having a film thickness of 40 nm and having compression stress of approximately 1.2 GPa by, for example, the plasma CVD method.

The second stress liner film 28 can be deposited by chemical reaction in the following conditions.

Hydrogen ($H_2$) gas: 1000 to 5000 $cm^3$/minute
Nitrogen ($N_2$) gas: 500 to 2500 $cm^3$/minute
Argon (Ar) gas: 1000 to 5000 $cm^3$/minute
Ammonia ($NH_3$) gas: 50 to 250 $cm^3$/minute
Trimethylsilanemonosilane gas: 10 to 50 $cm^3$/minute
Substrate temperature: 400 to 600° C.
Pressure: 0.13 to 0.67 kPa
RF power: 50 to 500 W After that, processing is performed so that the second stress liner film 28 remains only in the second region A2 by using the photolithography technique and the dry etching technique by using the photolithography technique and the dry etching technique.

The film having compression stress of 1.2 GPa is formed in the present embodiment, however, the stress is not limited to the value. The film thickness is not limited to the film thickness of the embodiment either.

Next, silicon oxide is deposited to have a film thickness of 500 to 1500 nm by using the CVD method and planarized by the CMP process to form the first insulating film 29. At this time, polishing is performed until reaching the stress liner films (27, 28).

Next, for example, silicon nitride is deposited to be approximately 20 to 50 nm by, for example, the plasma CVD method to form the polish stopper film 30.

Next, as shown in FIG. 4C, a resist film (not shown) having a pattern of having an opening on the second gate electrode by optical lithography and performs etching processing.

At this time, the pattern of the opening region is set to be, for example, approximately 10 to 20 nm larger than the pattern of the second gate electrode as a base in consideration of variations of the line width and alignment.

In the opening region, the polish stopper film 30 and the second stress line film 28 are removed by the dry etching processing by using, for example, fluorocarbon gas and the like.

Next, the high-melting point metal silicide layer 25 is removed by the dry etching processing using a chlorine gas and so on.

Next, the poly silicon layer 17 and the TiN film 16 are sequentially removed by the dry etching processing using chlorine or HBr gas.

Next, it is possible to remove the TiN film 16 as well as possible not to remove the TiN film 16. The film is removed in the drawing.

According to the above processes, a groove for forming the second gate electrode "T" is formed.

Figure 5A:
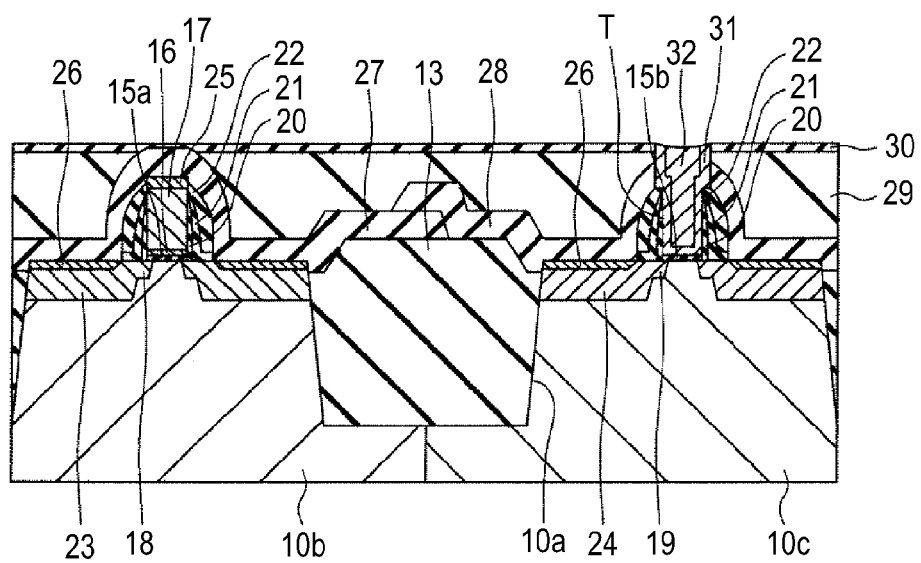
FIGS. 5A and 5B are schematic cross-sectional views showing manufacturing processes in the manufacturing method of the semiconductor device according to the first embodiment of the disclosure.

Next, as shown in FIG. 5A, the top of the second gate insulating film 15b is covered in the groove for forming the second gate electrode "T" and an inner wall of the groove for forming the second gate electrode "T" is covered by using, for example, the ALD method, the sputtering method or the CVD method to form the TiN film 31 to have a film thickness of 10 to 30 nm.

The portion touching the second gate insulating film 15b can be the film made of a metal or a metal compound having the work function suitable for the PTr, and ruthenium (Ru), tantalum carbide (TaC) and so on can be preferably used in addition to the TiN film 31.

Next, for example, the conductive layer 32 made of aluminum and so on is formed to have a film thickness of 30 to 100 nm on the TiN layer 31 so as to fill the groove for forming the second gate electrode "T" by using, for example, the sputtering method.

As the conductive layer 32, metals with low resistance are preferably used, and copper (Cu), tungsten (W) and so on can be preferably used in addition to the above aluminum.

Next, the CMP process is performed by using the polish stopper film 30 as a stopper and the TiN film 31 and the conductive layer 32 deposited on the outside of the groove for forming the second gate electrode "T" are removed.

As described above, the second gate electrode having the gate-last structure made of the layered body including the TiN film 31 and the conductive layer 32 is formed, which is buried in the groove for forming the second gate electrode "T".

Figure 5B:
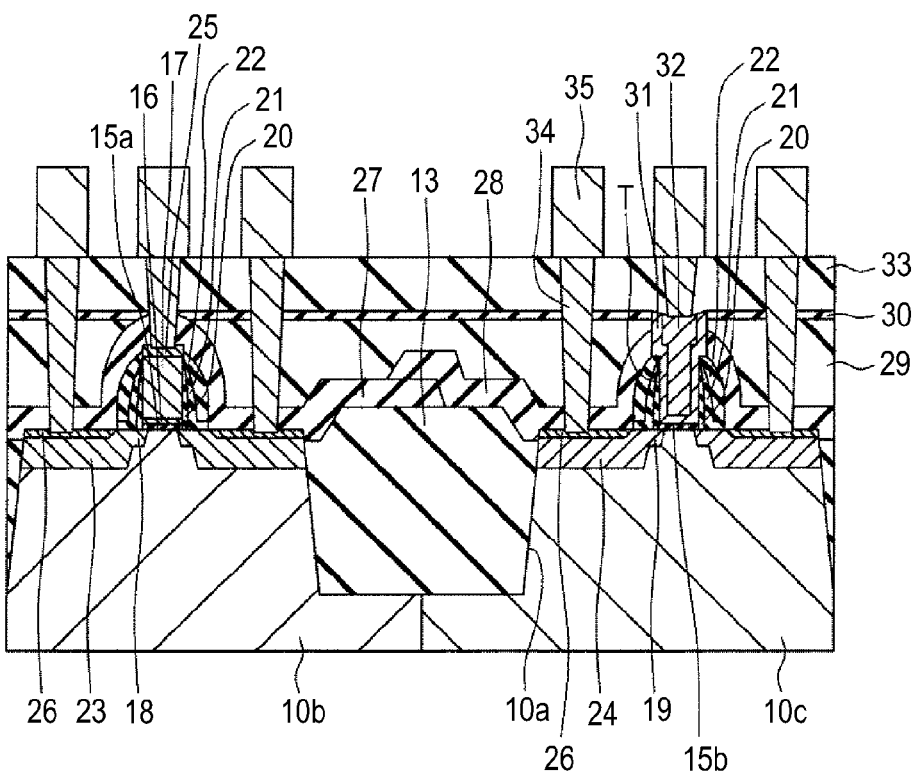

Next, as shown in FIG. 5B, silicon oxide is deposited to have a film thickness of 100 to 500 nm on the whole surface of the first region A1 and the second region A2 by using, for example, the CVD method to form the second insulating film 33.

Next, openings reaching the gate electrodes and the source/drain regions of the NTr and the PTr are formed so as to pierce through the second insulating film 33, the polish stopper film 30 and the first insulating film 29, a Ti/TiN and W are deposited and the CMP process is performed to form the contact plugs 34 so as to be buried. Moreover, the upper wiring 35 is formed on the surface of the second insulating film 33 so as to connect to the contact plugs 34.

As a method of forming the Ti/TiN film, the sputtering method using IMP can be also applied in addition to the CVD method, and the whole surface etch back can be used as the method of forming the plugs.

It is possible to perform multiwiring as wiring above the upper wiring 35 and to set the wiring according to the purpose. Additionally, wiring of Al and so on can be also formed.

In the manufacturing method of the semiconductor device according to the embodiment, the film can be removed by patterning and etching by lithography in the process of removing only the stress liner film having compression stress in part of the second gate electrode.

In the manufacturing method of the semiconductor device according to the embodiment, the carrier mobility can be increased and the high performance can be realized particularly in the micro area in which the distance between electrodes is short both in the n-channel MISFET (NTr) and the p-channel MISFET (PTr) included in the CMOS circuit.

The semiconductor device according to the embodiment has the structure in which the film having tensile stress is continuously formed in the first region NTr, the film having compression stress is formed in the second region PTr and the upper part of the second gate electrode is removed.

The manufacturing process includes the gate last structure in which the second gate electrode is displaced after removing the film having compression stress.

The compression stress $S_{yy}$ in the "yy" direction is maintained in the NTr and the stress in the "xx" direction is efficiently increased in the PTr, thereby realizing the CMOS circuit having higher carrier mobility.

The tensile stress film and the compression stress film are formed by using the silicon nitride film, thereby controlling the stress flexibly.

The films also double as the etching stopper film (Contact Etch Stopper Liner) of the contact hole.

Additionally, the high-dielectric film is formed as the first and second gate insulating films and a metal or a metal compound is used for the portion touching the second gate insulating film made of the second gate electrode material, thereby allowing the effective gate oxide thickness (EOT) to be thinner as well as forming the transistor having the suitable threshold Vth. The CMOS circuit suppressing the short-channel effect can be realized as described above.

It is preferable that the first gate insulating film is formed by using an insulating material having a relative dielectric constant at least higher than 8.0 in the process forming the first gate insulating film and that the second gate electrode is formed by using a metal or a metal compound at the portion touching the first gate insulating film in the process forming the second gate electrode. Accordingly, the effective gate oxide thickness (EOT) can be made thinner.

<Modification Example>

In the above first embodiment, the first gate insulating film 15a and the second gate insulating film 15b are made of the same material.

However, the first gate insulating film 15a and the second gate insulating film 15b can be made of different insulating materials in accordance with necessary dielectric constant characteristics and so on.

In the modification example, the first gate insulating film 15a and the second gate insulating film 15b are made of different materials.

Processes in the modification example are the same as in the first embodiment until the process reaches the step shown in FIG. 4C.

Figures 6A, 6B, 6C:
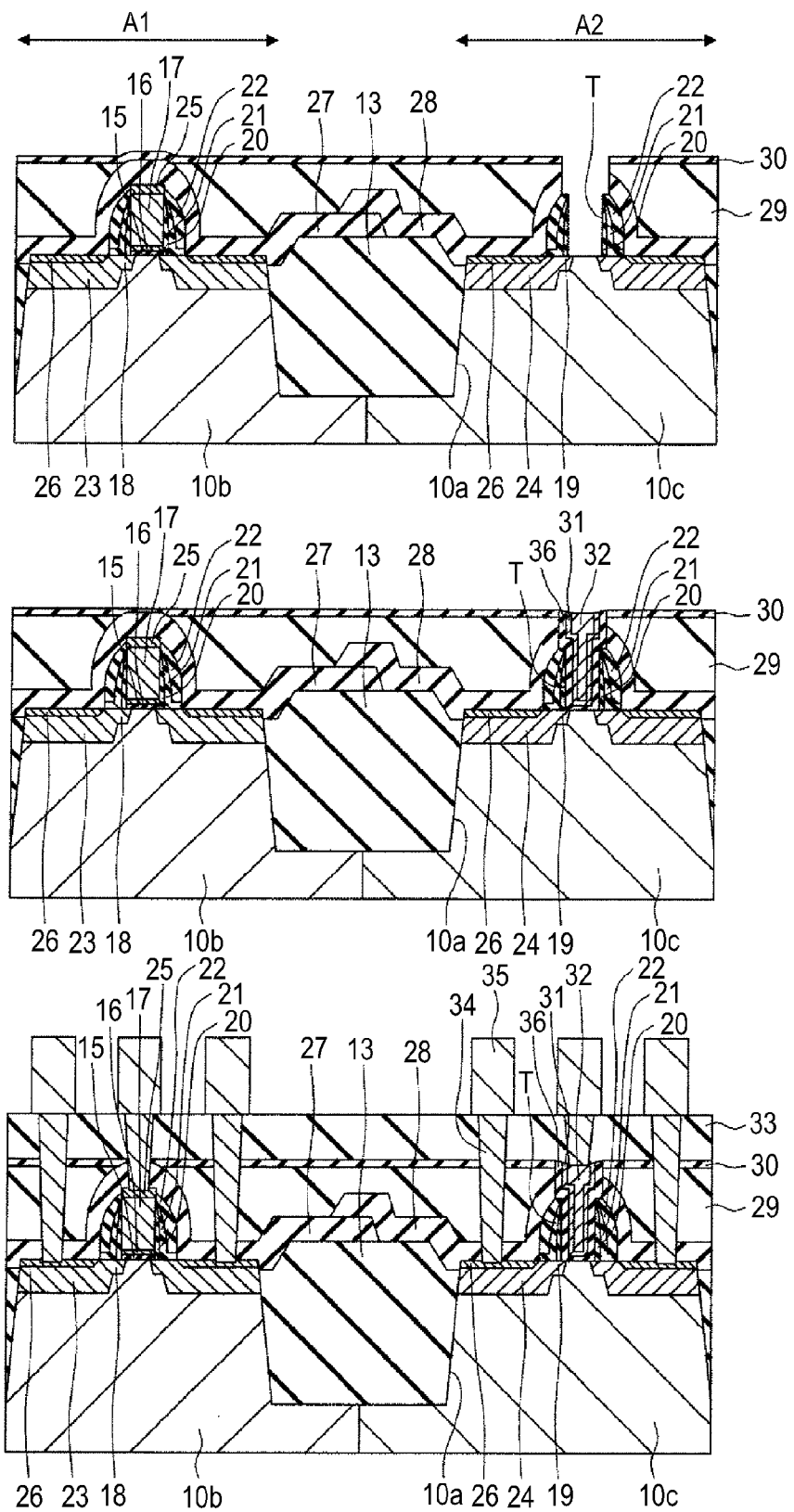
FIGS. 6A to 6C are schematic cross-sectional views showing manufacturing processes in the manufacturing method of the semiconductor device according to a modification example of the first embodiment of the disclosure.

Next, as shown in FIG. 6A, the second gate insulating film 15b is removed.

The groove for forming the second gate electrode "T" is formed in this manner.

Next, as shown in FIG. 6B, at least a bottom surface of the groove for forming the second gate electrode "T" is covered as well as the inner wall thereof is covered by using, for example, the CVD (Chemical Vapor Deposition) method, the ALD (Atomic Layer Deposition) method or the like to form a second gate insulating film 36.

Next, the TiN film 31 is formed to have a film thickness of 10 to 30 nm on the second gate insulating film 36 in the groove for forming the second gate electrode "T" by using, for example, the ALD method, the sputtering method, the CVD method or the like.

Next, the conductive layer 32 made of aluminum and the like is formed to have a film thickness of 30 to 100 nm on the TiN film 31 so as to fill the groove for forming the second gate electrode "T" by using, for example, the sputtering method and so on.

Next, the second gate insulating film 36, the TiN film 31 and the conductive layer 32 deposited at the outside of the groove for forming the second gate electrode "T" are removed by performing the CMP process using the polish stopper film 30 as a stopper.

According to the above process, the second gate electrode having the gate-last structure made of the layered body including the TiN film 31 and the conductive layer 32 is formed, which is buried in the groove for forming the second gate electrode "T".

Next, as shown in FIG. 6C, the second insulating film 33 is formed, openings reaching the gate electrodes and the source/drain regions of the NTr and the PTr are formed, the contact plugs 34 and the upper wiring 35 are formed.

In the manufacturing method of the semiconductor device according to the embodiment, the carrier mobility can be increased and the high performance can be realized particularly in the micro area in which the distance between electrodes is short both in the n-channel MISFET (NTr) and the p-channel MISFET (PTr) included in the CMOS circuit.

It is preferable that the second gate insulating film is formed by using an insulating material having a relative dielectric constant at least higher than 8.0 in the process forming the second gate insulating film. Accordingly, the effective gate oxide thickness (EOT) can be made thinner.

<Second Embodiment>
[Structure of the Semiconductor Device]

Figure 7:
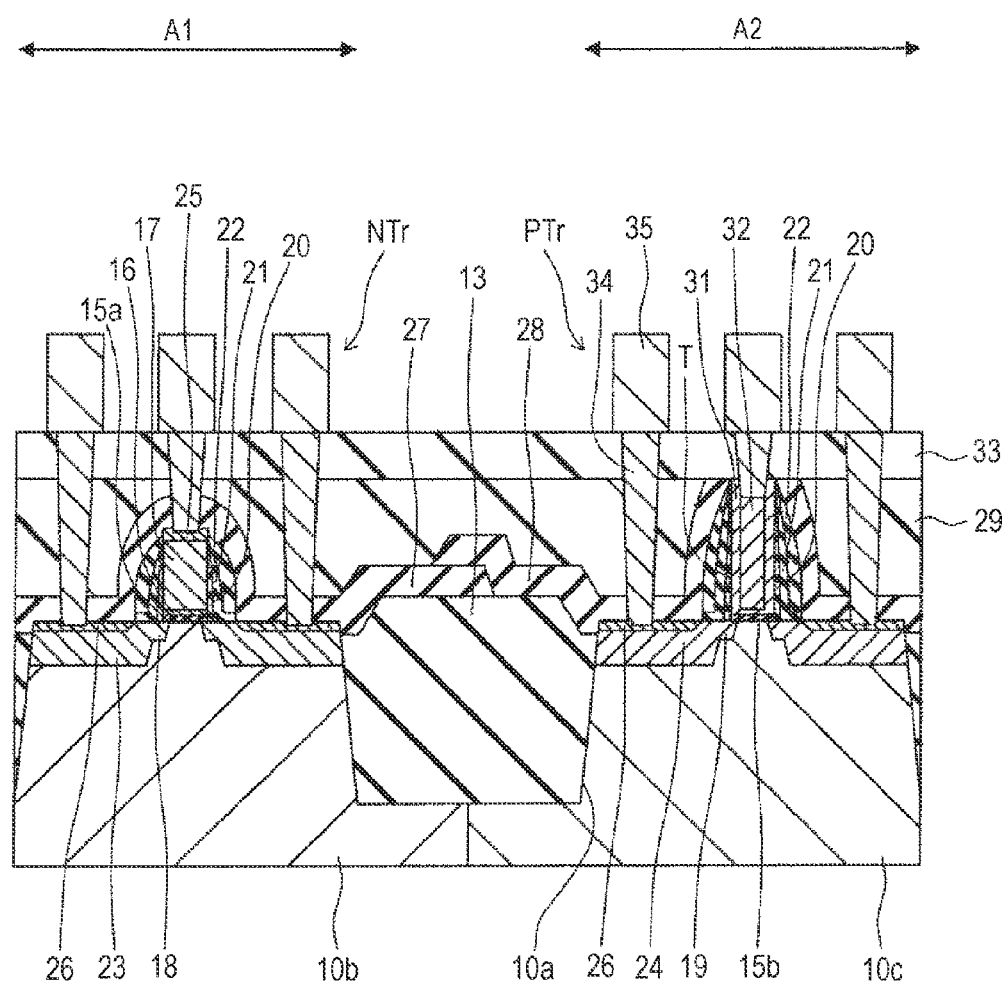
FIG. 7 is a schematic cross-sectional view of a semiconductor device according to a second embodiment of the disclosure.

FIG. 7 is a schematic cross-sectional view of a semiconductor device according to the embodiment.

In the embodiment, the second gate electrode is formed to be higher than that of the first embodiment. In addition, the polish stopper film is omitted.

The structure is the same as that of the semiconductor device of the first embodiment except the above.

[Manufacturing Method of the Semiconductor Device]

Processes in the embodiment are the same as in the first embodiment until the process reaches the step shown in FIG. 2B.

Figure 8A:
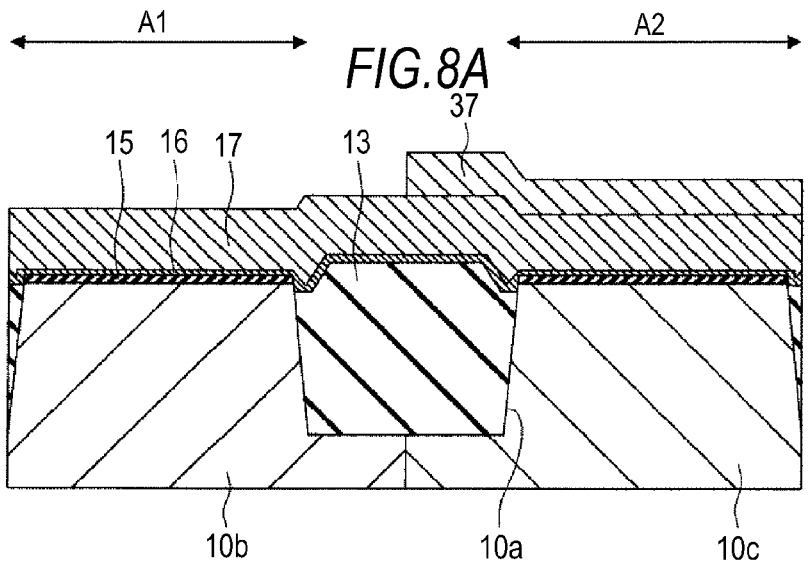
FIGS. 8A to 8C are schematic cross-sectional views showing manufacturing processes in a manufacturing method of the semiconductor device according to the second embodiment of the disclosure.

Next, as shown in FIG. 8A, an silicon oxide film (not shown) of approximately 1 to 3 nm is formed on the surface of the polysilicon layer 17 in, for example, the second region A2 and a height adjustment layer 37 made of, for example, the polysilicon layer is formed to have a film thickness of 30 to 100 nm.

The silicon oxide film (not shown) is formed by a thermal oxidation process, the RTO processing, a plasma oxidation process and so on.

The height adjustment layer 37 is a layer for changing the height with respect to a first gate electrode of the NTr for polishing only the stress liner film in the PTr region at the time of the later-described CMP process. The height adjustment layer 37 can be made of amorphous silicon, silicon oxide, silicon nitride and the like.

The subsequent processes are performed in substantially the same manner as the first embodiment.

Figure 8B:
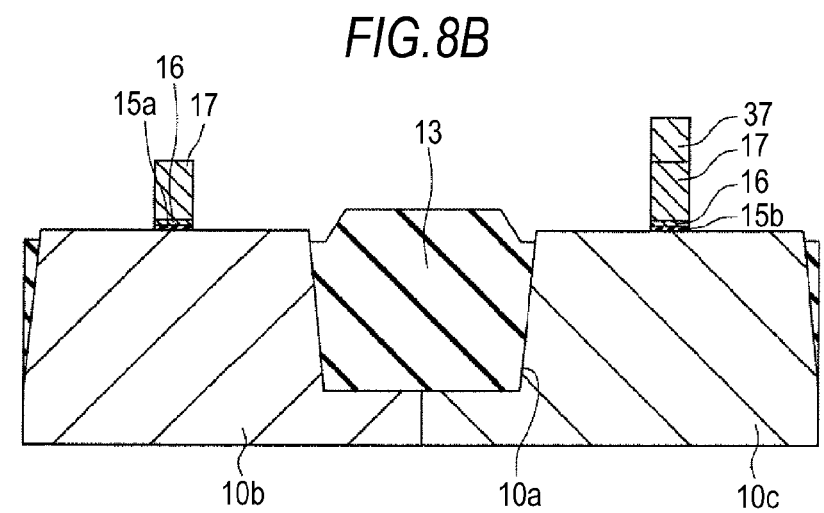

That is, as shown in FIG. 8B, the first gate electrode made of the layered body including the titanium nitride (TiN) film 16 and the polysilicon layer 17 is formed in the first region A1.

In the second region A2, a second gate electrode made of a layered body and so on including the titanium nitride (TiN) film 16 and the polysilicon layer 17 and the height adjustment layer 37.

Figure 8C:
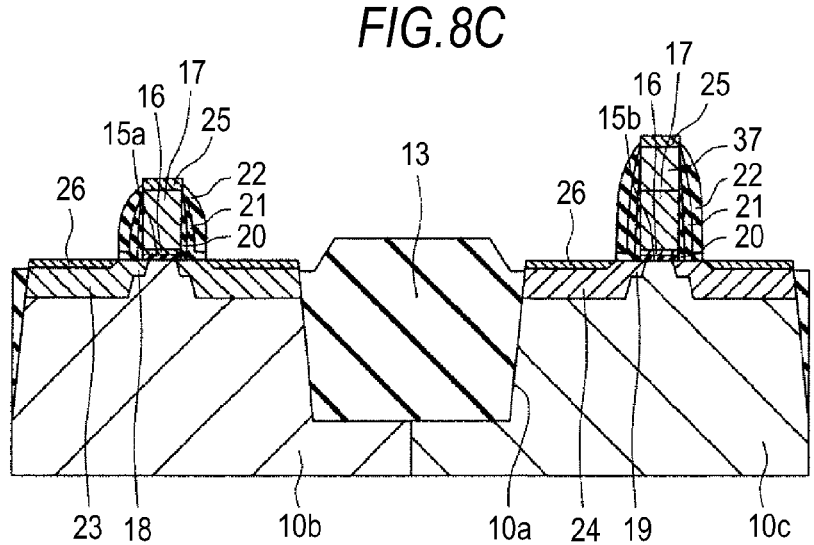

Next, as shown in FIG. 8C, the extension regions (18, 19), the sidewall insulating film including the silicon nitride film 20, the silicon oxide film 21 and the silicon nitride film 22, the source/drain regions (23, 24) and the high-melting point metal silicide layers (25, 26) are formed.

Figures 9A, 9B, 9C:
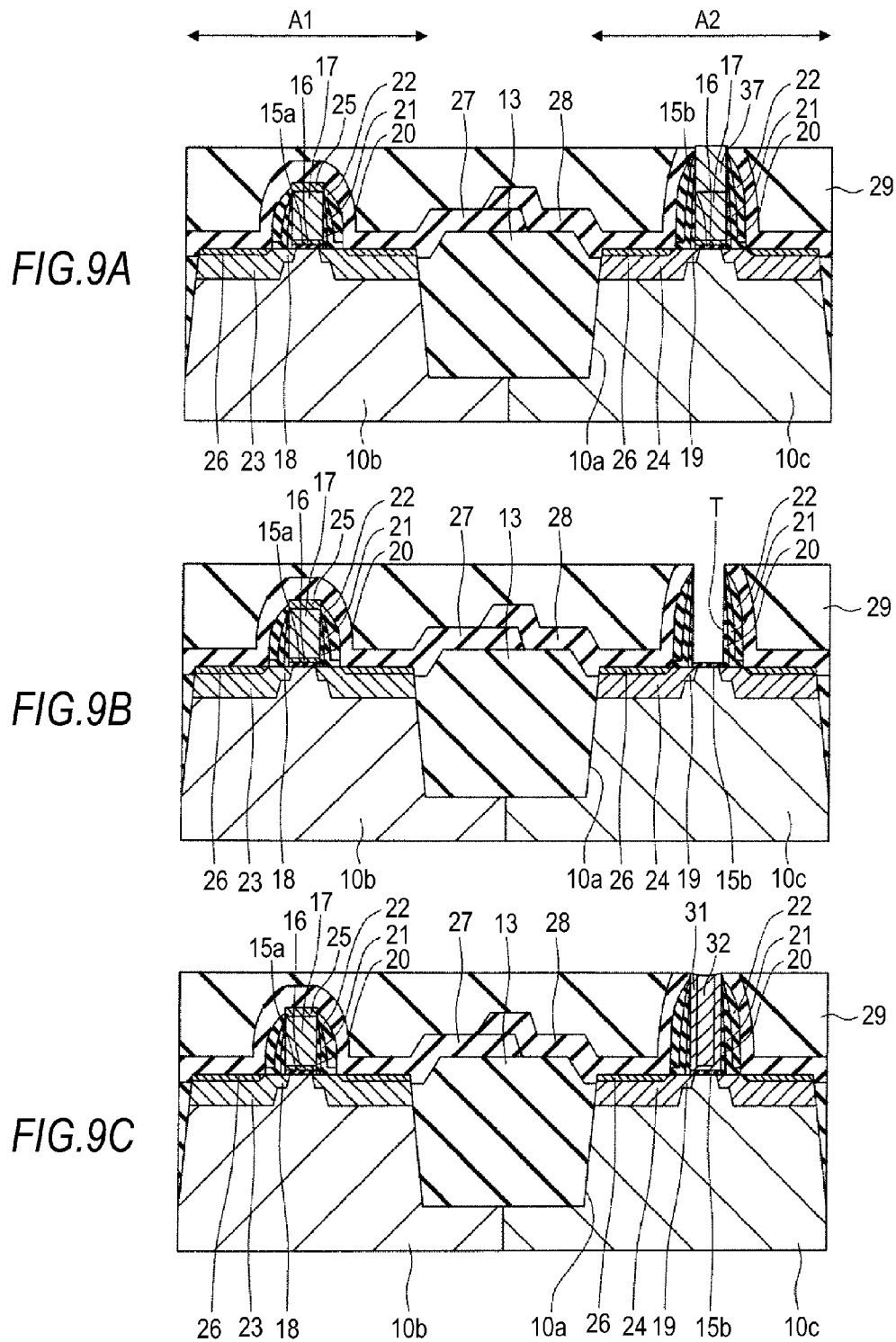
FIGS. 9A to 9C are schematic cross-sectional views showing manufacturing processes in the manufacturing method of the semiconductor device according to the second embodiment of the disclosure.
Figure 10:
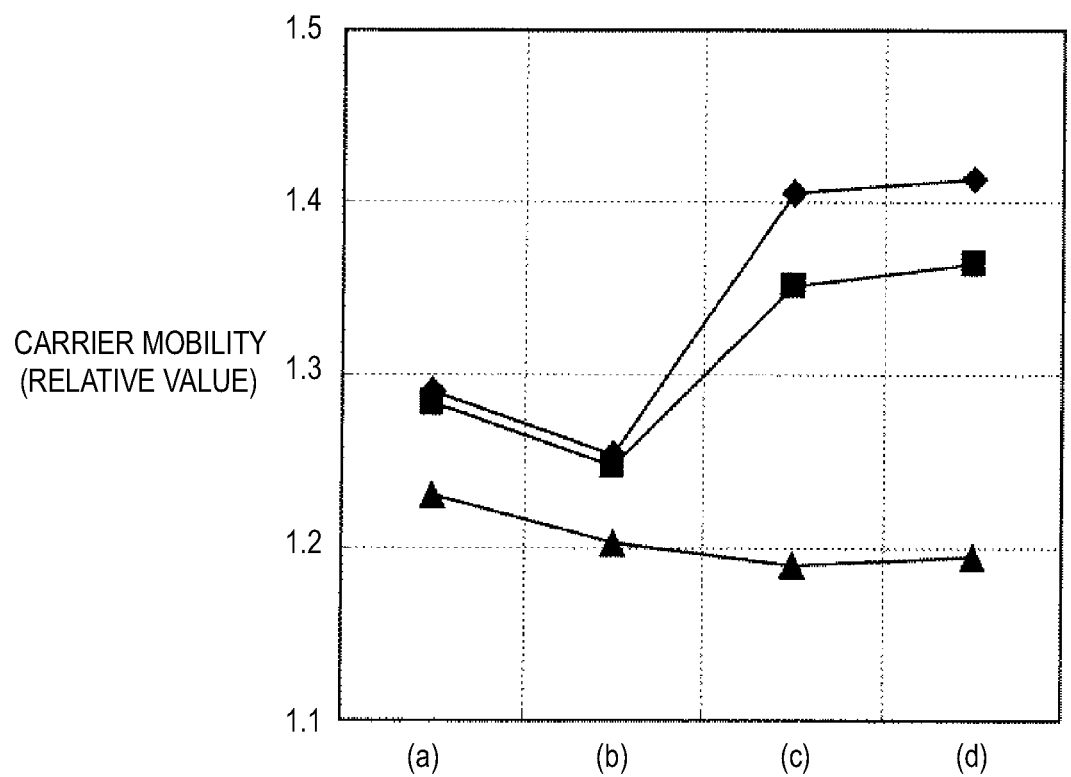
FIG. 10 shows results obtained by plotting relative variations of carrier mobility in respective processes with respect to the gate pitch in the NTr having a gate-last structure according to a related-art example.

Next, as shown in FIG. 9A, the first stress liner film 27 having tensile stress is formed on the whole surface of the first region A1 and the second stress liner film 28 having compression stress is formed on the whole surface of the second region A2.

Next, silicon oxide is deposited to have a film thickness of 500 to 1500 nm by the CVD method and planarized by the CMP process to thereby form the first insulating film 29.

At this time, the height adjustment layer 37 is removed and polished until the polysilicon layer 17 in the second region A2 is exposed, thereby removing only the second stress liner film 28 in the PTr region by polishing.

Next, as shown in FIG. 9B, the polysilicon layer 17 exposed in the above process and the TiN film 16 are sequentially removed.

Next, it is possible to remove the TiN film 16 as well as possible not to remove the TiN film 16. The film is removed in the drawing.

According to the above, the groove for forming the second gate electrode "T" is formed.

Next, as shown in FIG. 9C, the top of the second gate insulating film 15b is covered in the groove for forming the second gate electrode "T" and an inner wall of the groove for forming the second gate electrode "T" is covered to form the TiN film 31.

Next, the conductive layer 32 is formed on the TiN layer 31 so as to fill the groove for forming the second electrode "T" by using, for example, the sputtering method.

Next, the TiN film 31 and the conductive layer 32 deposited at the outside of the groove for forming the second gate electrode "T" are removed.

According to the above process, the second gate electrode having the gate last structure made of a layered body including the TiN film 31 and the conductive layer 32 is formed, which is buried in the groove for forming the second gate electrode "T".

Next, the second insulating film 33 is formed, openings reaching the gate electrodes and the source/drain regions of the NTr and the PTr are formed, the contact plugs 34 are formed so as to be buried and the upper wiring 35 is formed.

The semiconductor device according to the embodiment can be manufactured as described above.

In the manufacturing method of the semiconductor device according to the embodiment, the carrier mobility can be increased and the high performance can be realized particularly in the micro area in which the distance between electrodes is short both in the n-channel MISFET (NTr) and the p-channel MISFET (PTr) included in the CMOS circuit.

The semiconductor device according to the embodiment has the structure in which the film having tensile stress is continuously formed in the first region NTr, the film having compression stress is formed in the second region PTr and the upper part of the second gate electrode is removed.

The manufacturing process includes the gate last structure in which the second gate electrode is displaced after removing the film having compression stress.

The compression stress $S_{yy}$ in the "yy" direction is maintained in the NTr and the stress in the "xx" direction is efficiently increased in the PTr, thereby realizing the CMOS circuit having higher carrier mobility.

The tensile stress film and the compression stress film are formed by using the silicon nitride film, thereby controlling the stress flexibly.

The films also double as the etching stopper film (Contact Etch Stopper Liner) of the contact hole.

Additionally, the high-dielectric film is formed as the first and second gate insulating films and a metal or a metal compound is used for the portion touching the second gate insulating film made of the second gate electrode material, thereby allowing the effective gate oxide thickness (EOT) to be thinner as well as forming the transistor having the suitable threshold Vth. The CMOS circuit suppressing the short-channel effect can be realized as described above.

As described above, in the process of removing only the film having compression stress on the part of the second gate electrode, the film can be removed by the CMP process.

The film can be also removed in the in a self-aligned manner by forming a higher region in advance.

The present disclosure is not limited to the above explanation.

For example, different types of stress liner films in the NTr and the PTr can be formed in the embodiment, however, it is not limited to this, and a structure of including the stress liner film common to the NTr and the PTr can be also applied.

In the second embodiment, it is also preferable that the second gate insulating film is removed as in the modification example of the first embodiment and the second gate insulating film having a high-dielectric constant is formed.

Other various modifications can be made within the scope not departing from the gist of the disclosure.

The present disclosure contains subject matter related to that disclosed in Japanese Priority Patent Application JP 2010-139847 filed in the Japan Patent Office on Jun. 18, 2010, the entire contents of which is hereby incorporated by reference.

What is claimed is:

1. A manufacturing method of a semiconductor device comprising:
    forming a first gate insulating film in a first region and in a second region on a semiconductor substrate in an active area, wherein the first region is a forming region of an n-channel field effect transistor and the second region is a forming region of a p-channel field effect transistor;
    forming a first gate electrode on the first gate insulating film in the first region;
    forming a first gate electrode on the first gate insulating film in the second region;
    forming source/drain regions by introducing impurities in the semiconductor substrate at both sides of the first gate electrode in the first region and the first gate electrode in the second region;
    performing heat treatment of activating the impurities in the source/drain regions;
    forming a stress liner film applying stress on the semiconductor substrate so as to cover a whole surface of the first gate electrode in the first region and a whole surface of the first gate electrode in the second region;
    removing the stress liner film at an upper portion of the first gate electrode in the second region to expose the upper portion of the first gate electrode in the second region, wherein the stress liner film formed over the whole surface of the first gate electrode in the first region remains;
    forming a groove for forming a second gate electrode by completely removing the first gate electrode in the second region; and
    forming the second gate electrode in the groove.

2. The manufacturing method of the semiconductor device according to claim 1, wherein, in the process of forming the stress liner film, a first stress liner film is formed in the first region and a second stress liner film which is different from the first stress liner film in stress characteristics is formed in the second region.

3. The manufacturing method of the semiconductor device according to claim 2, wherein:
    in the process of forming the first stress liner film, a stress liner film applying tensile stress with respect to a gate length direction of the first gate electrode in the first region on the semiconductor substrate is formed, and
    in the process of forming the second stress liner film, a stress liner film applying compression stress with respect to the gate length direction of the first gate electrode in the second region on the semiconductor substrate is formed.

4. The manufacturing method of the semiconductor device according to claim 1, wherein the process of removing the stress liner film at the upper portion of the first gate electrode in the second region to expose the upper portion of the first gate electrode in the second region includes a process of forming a resist film having a pattern in which a portion corresponding to the upper portion of the first gate electrode in the second region is open and the process of removing the stress liner film at the upper portion of the first gate electrode in the second region by using the resist film as a mask.

5. The manufacturing method of the semiconductor device according to claim 1, wherein:
    in the process of forming the first gate electrode on the first gate insulating film in the first region and the first gate electrode on the first gate insulating film in the second region, the first gate electrode in the second region is formed to have a film thickness thicker than the first gate electrode in the first region,
    the process of removing the stress liner film at the upper portion of the first gate electrode in the second region to expose the upper portion of the first gate electrode in the second region includes a process of polishing the stress liner film from the top thereof until reaching at least upper part of the first gate electrode in the second region.

6. The manufacturing method of the semiconductor device according to claim 1, wherein, in the process of forming the second gate electrode in the groove, the second gate electrode is formed on an upper layer of the first gate insulating film in the second region.

7. The manufacturing method of the semiconductor device according to claim 1, wherein:
    a process of removing the first gate film of the groove for forming the second gate electrode and a process of forming a second gate insulating film by covering at least a bottom portion of the groove for forming the second gate electrode is performed between the process of forming the groove for forming the second gate electrode by removing the first gate electrode in the second region and the process of forming the second gate electrode in the groove for forming the second gate electrode, and
    in the process of forming the second gate electrode in the groove for forming the second gate electrode, the second gate electrode is formed on the upper layer of the second gate insulating film.

8. The manufacturing method of the semiconductor device according to claim 7, wherein, in the process of forming the second gate insulating film, the second gate insulating film is formed by using an insulating material having a relative dielectric constant at least higher than 8.0.

9. The manufacturing method of the semiconductor device according to claim 1, wherein, in the process of forming the stress liner film, a silicon nitride film is formed as the stress liner film.

10. The manufacturing method of the semiconductor device according to claim 1, wherein:

in the process of forming the first gate insulating film in the first region and in the second region, the first gate insulating film is formed by using an insulating material having a relative dielectric constant at least higher than 8.0, and in the process of forming the second gate electrode, the second gate electrode is formed by using a metal or a metal compound at a portion touching the first gate insulating film in the second region.

* * * * *